United States Patent [19]

Dyck et al.

[11] 3,717,770

[45] Feb. 20, 1973

[54] HIGH-DENSITY LINEAR PHOTOSENSOR ARRAY

[75] Inventors: Rudolph H. Dyck, Palo Alto, Calif.; Louis J. Kabell, Palm Bay, Fla.

[73] Assignee: Fairchild Camera and Instrument Corporation, Mountain View, Calif.

[22] Filed: Aug. 2, 1971

[21] Appl. No.: 168,249

[52] U.S. Cl. ............250/211 J, 250/209, 317/235 N, 307/117

[51] Int. Cl. ..............................................H01l 15/00

[58] Field of Search.......250/220 M, 211 J, 208, 209, 250/219 D, 219 DC; 317/235 N; 307/117

[56] References Cited

UNITED STATES PATENTS

| | | | |
|---|---|---|---|
| 3,437,890 | 4/1969 | Krohl et al. | 250/211 J X |
| 2,735,919 | 2/1956 | Shower | 250/211 J X |
| 3,475,613 | 10/1969 | Meyers | 250/209 X |
| 3,317,733 | 5/1967 | Horton et al. | 250/211 J |
| 2,985,805 | 5/1961 | Nelson | 317/235 N |
| 3,400,272 | 9/1968 | Dym et al. | 250/211 J |

*Primary Examiner*—Walter Stolwein
*Attorney*—Roger S. Borvoy et al.

[57] ABSTRACT

A plurality of semiconductor chips each containing a multiplicity of light sensitive elements formed in a line near one principle edge of each chip are arranged in two rows so as to form two lines of light sensitive elements. The semiconductor chips in each row are staggered so as to be substantially opposite the spaces between the semiconductor chips in the other row. The light sensitive elements on the chips in the two rows are arranged so as to effectively form one line of light sensitive elements.

2 Claims, 14 Drawing Figures

INVENTORS
RUDOLPH H. DYCK
LOUIS J. KABELL
BY Alan H. MacPherson
ATTORNEY

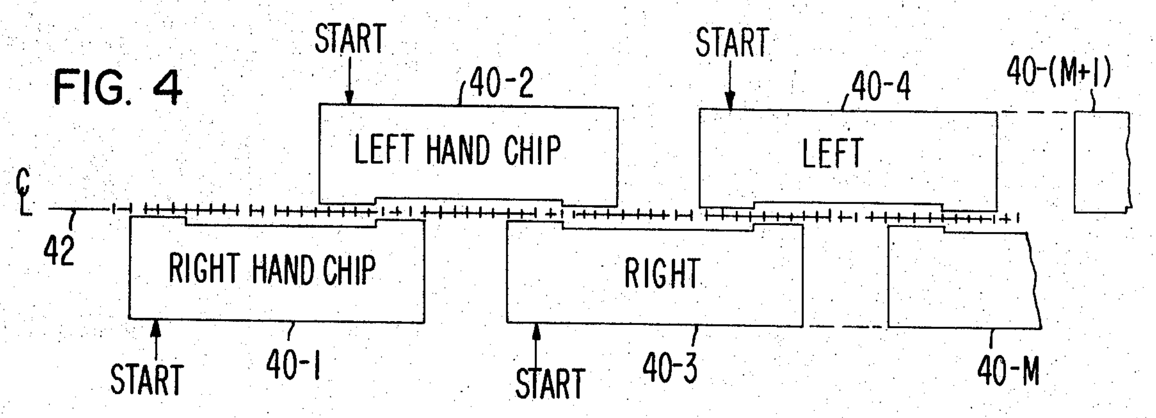
FIG.5a
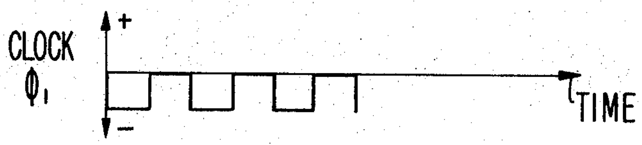
FIG.5b
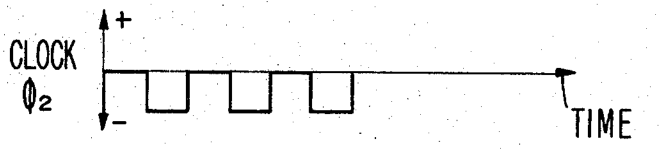
FIG.5c
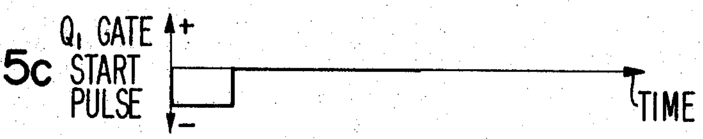
FIG.5d
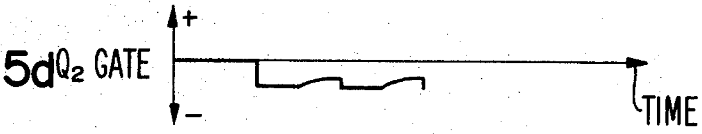
FIG.5e
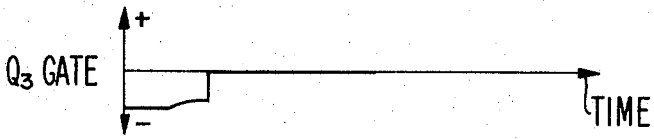
FIG.5f
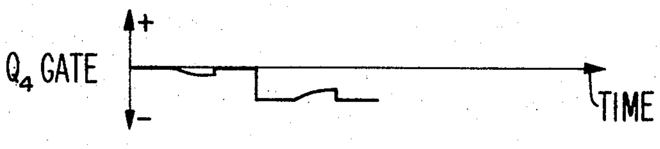
FIG.5g
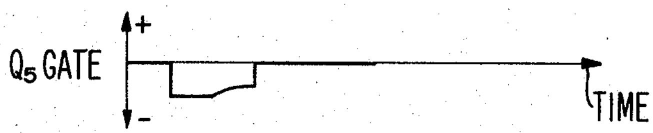
FIG.5h
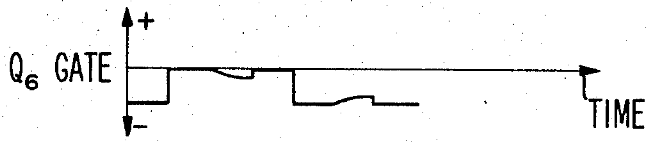
INVENTORS
RUDOLPH H. DYCK
LOUIS J. KABELL
BY Alan H. MacPherson
ATTORNEY INVENTORS
RUDOLPH H. DYCK
LOUIS J. KABELL
BY Alan H. MacPherson
ATTORNEY

HIGH-DENSITY LINEAR PHOTOSENSOR ARRAY

BACKGROUND OF THE INVENTION

1. Field of the Invention

This invention relates to light sensing devices and, in particular, to a structure wherein a plurality of semiconductor chips each containing a multiplicity of light sensing elements are arranged on a substrate in a bilinear manner so as to obtain a substantially linear arrangement of light sensitive elements.

2. Prior Art

Linear solid state sensor arrays have been made with up to on the order of 300 sensing elements. While such sensing arrays are useful for some purposes, the resolution of such an array is less than is desired for many applications. Numerous solutions have been proposed to the general problem of how to make a light sensing array containing on the order of 10,000 sensing elements. Among the proposals are the simple butting of one array chip to the next. This structure has the disadvantage of loss of a small portion of the image which is focused on portions of the array chips abutting each other. Another proposal is to use a beam splitter which places 50 percent of the image power on one set of arrays and the rest of the image power on a second set of arrays. While the entire linear section of the image is sensed, this has the disadvantage of increasing the minimum detectable signal by a factor of two. A third proposal involves the use of fiber optics to take a linear section of an image and separate it into segments suitable for coupling to smaller arrays. The arrays can then be arranged in almost any convenient configuration. However, fiber optic structures have a substantial non-uniformity of transmittance which makes it difficult to obtain faithful reproduction of the image impinging on the photosensing array.

SUMMARY OF THE INVENTION

This invention overcomes may of the problems of the prior art and makes full use of the available image intensity. The structure of this invention is greatly simplified relative to prior art structures.

According to this invention, a plurality of semiconductor chips, each containing a multiplicity of light sensitive elements formed in a line near one principle edge of each chip are arranged in two rows so as to form two lines of light sensing elements. The semiconductor chips in each row are staggered so as to be substantially opposite the spaces between the semiconductor chips in the other row. The light sensitive elements on the chips in the two rows are arranged so as to effectively form one line of light sensitive elements. To do this, the edges of the chips near which are formed the light sensitive elements, are arranged uniformly near an imaginary center line running between the two rows of semiconductor chips. A selected number of stations are defined along this center line and the chips are arranged so that a light sensitive element is adjacent each station. In one embodiment, the stations are uniformly spaced along the center line.

By staggering the chips in each row and locating these chips opposite the spaces between the chips in the other row, a light sensitive element can be located adjacent each station on the center line. This eliminates the between-chip dead spots common in certain prior art arrays.

In addition to the line of light sensing elements each semiconductor chip contains a scan generator, interconnect leads, and a line of sampling switches for periodically reading out the signal detected by each light sensing element. The scan generating circuit is essentially a shift register. The sampling switches, driven by the scan generator, interconnect each light sensing element with a utilization circuit.

If desired, the sampling circuit can be arranged to allow each stage of the scan generator to sample two or more light sensing elements. Use of this sampling technique allows the density or "pitch" of the light sensing elements to be two or more times that of the stages of the scan generator and makes possibly more light sensing elements on a given self-scanned chip.

In a typical application in which an image is moved perpendicularly across the bilinear array, the resulting array produces a continuous output image.

The extent to which the array of sensing elements is non-linear can be compensated for in the readout circuitry by displacing the image produced by each light sensing element the proper amount from a reference line.

DESCRIPTION OF THE DRAWINGS

FIG. 4 shows the arrangement of a plurality of semiconductor chips to form the bilinear array of this invention;

FIGS. 5*a* through 5*i* show wave forms generated at various points in the scan generator and the sampling circuitry shown in FIG. 3.

DETAILED DESCRIPTION

Figure 1:
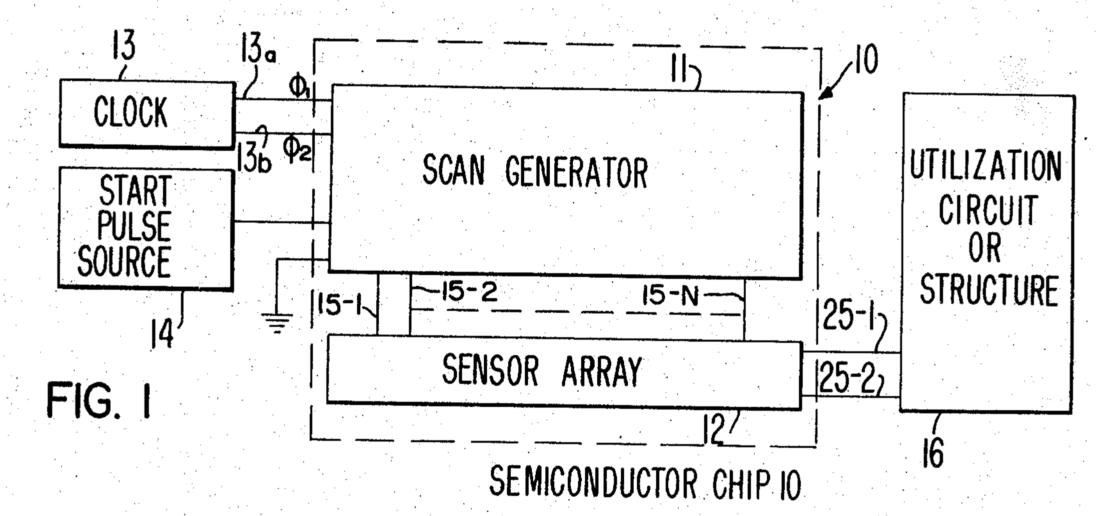
FIG. 1 shows the structure of this invention in schematic block form.

FIG. 1 shows in block diagram form the scan generator 11 and sensor array 12 on each chip in circuit relation with the clock 13, start pulse source 14, and output structure 16 external to the chip. Sensor array 12 comprises a multiplicity of light sensing elements located upon the semiconductor chip. Scan generator 11, also on the chip, reads out the signals stored by the light sensing elements on that chip. Scan generator 11, comprising in one embodiment a shift register, is driven by clock set 13 external to the chip 10 which produces two series of output pulses. One series of pulses $\Phi_1$ appears on line 13*a* and is 180° out of phase with the other set of output pulses $\Phi_2$ which appears on line 13*b*. To start the scan generator, a start pulse from start pulse source 14 is applied to the scan generator simultaneously with a pulse from clock 13 on line 13*a*. The start pulse is driven through scan generator 11 by the signals from clock 13. The start pulse sequentially activates each light sensing element in sensing array 12 by means of signals applied to array 12 on lines 15-1 through 15-N.

N represents the number of light sensing elements in sensor array 12.

The output signals from sensor array 12 are transmitted on lines 25-1 and 25-2 to utilization structure 16. Structure 16 is a display device such as a cathode ray tube, a signal storage mechanism such as a magnetic tape or any other suitable structure. In addition the output pulse from scan generator 11 is taken by structure 16 and may be used to restart the scan generator on either the same chip or on another chip.

FIG. 4 shows the arrangement, according to this invention, of semiconductor chips containing light sensitive elements near their edges. As shown in FIG. 4, the semiconductor chips are arranged along two parallel lines. Chips 40-1, 40-3 through 40-M are labeled right hand chips, while the chips 40-2, 40-4 through 40-(M+1) are labeled left hand chips. The left hand chips and right hand chips are arranged so that their light sensing elements face, are near to and are parallel to center line 42. The right hand chips are arranged parallel to line 42 in staggered relationship with the distance between the end of the light sensing array on one right hand chip and the beginning of the light sensing array on the next right hand chip being equal to the length of the light sensing array on the left hand chip adjacent these two right hand chips. The circuits on the left and right hand chips are layed out as mirror images of each other.

In one embodiment, 10 chips with 128 elements each on 1 mil centers were arranged in two lines in staggered relationship in accordance with this invention. Thus, a total of 1,280 light sensing elements were present in this structure. Other numbers of light sensing elements large than this can be assembled together if desired.

Figure 2A:
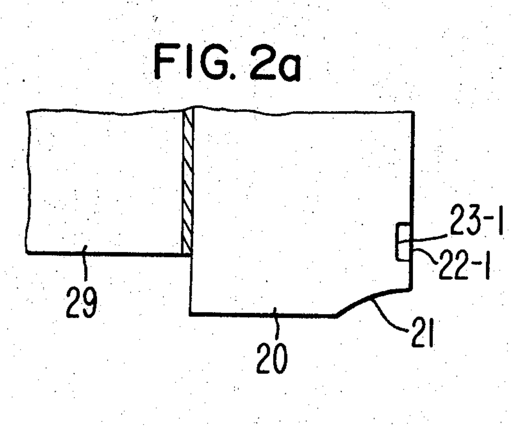
FIGS. 2*a* and 2*b* show cross sectional and top views, respectively, of a portion of a semiconductor chip, 20 near its edge 21, and particularly show the elements 22 arranged in accordance with this invention.
Figure 2B:
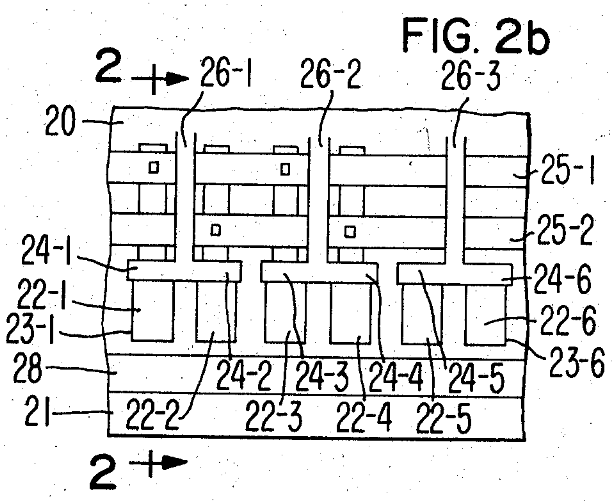

FIGS. 2*a* and 2*b* show the arrangement of the light sensing elements near the edge of a typical semiconductor chip used in this invention and the profile of the chip. Semiconductor chip 20 of one conductivity type has formed in it a plurality of regions 22 of opposite conductivity type (of which regions 22-1 through 22-6 are shown in FIG. 2*b*) along a line near the edge 21 of the chip. A light sensitive PN junction 23 separates region 22 from semiconductor material 20. Edge 21 is beveled by chemical etching while chip 20 is still part of a wafer. Chemical etching is used because it causes less surface damage then do edge-grinding processes and this, in turn, results in improved performance of the array at low illumination levels. Running along the edge 21 of chip 20 between the light sensing elements 22 and the curved portion 21 is an opaque strip 28 which in one embodiment is metal.

Each photosensitive element 22, 23 serves as the source of an MOS device. The gates 24 to each pair of photosensitive elements 22, 23 are controlled by a single lead 26. Thus, a pair of photosensitive elements such as the elements associated with PN junctions 23-1 and 23-2 is readout simultaneously in accordance with this invention by a signal applied on lead 26-1 to gates 24-1 and 24-2. Attached to a drain associated with one photosensitive element in each pair is a first video read line (line 25-1).

Figure 3:
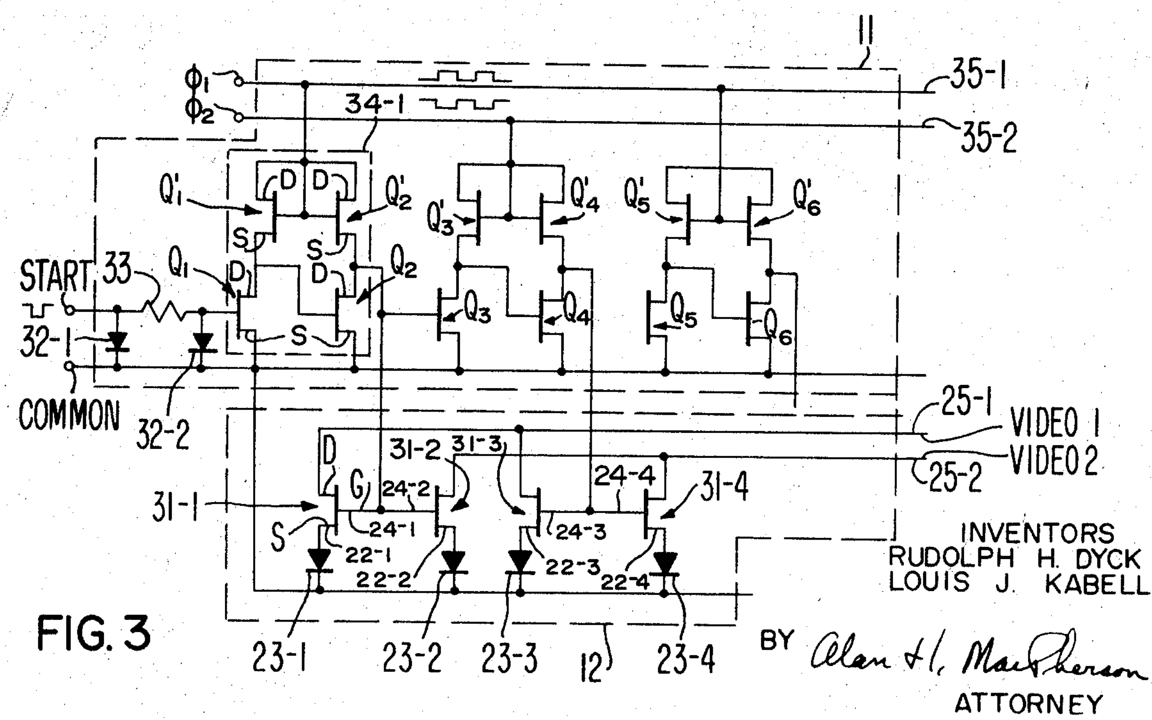
FIG. 3 shows the electrical schematic of the circuitry on one chip for reading out the signal detected by each light sensing element on the edge of the chip.

Scan circuitry suitable for use in this invention is shown in detail in FIG. 3. This circuitry is described in conjunction with the wave forms of FIGS. 5*a* through 5*i*. Each light sensing element 22, 23 on a semiconductor chip is represented by PN junctions 23-1 through 23-4, shown as photodiodes and sources 22-1 through 22-4. It should be understood that it is desirable to make the center-to-center spacings of these PN junctions as small as possible. For convenience and simplicity, only four such junctions are shown. The photodiodes operate in the storage mode. Such operation is described for example in U.S. Pat. No. 3,427,461 issued Feb. 11, 1969 on an invention of Gene P. Weckler.

The operation of the circuitry shown in FIG. 3 will be described first in conjunction with diode 23-1. When FET switching device 31-1 is turned off, photodiode 23-1 is left with a quantity of charge stored on its depletion layer capacitance. In the dark, the decay rate of this charge depends directly upon the dark leakage current of the photodiode. For most applications the dark current is sufficiently small that it may be neglected. Half voltage decay times are typically 5 to 50 seconds when measured in total darkness and at room temperature.

When illuminated, the photo-generated current adds to the dark current discharging the junction capacitance more rapidly. When photodiode 23-1 is periodically re-charged, the charge required to re-establish the initial condition on the back-biased junction 23-1 is directly proportional to the time integral of the photo-generated current. With suitable output circuitry a signal can be obtained which is directly proportional to this charge and hence to the integrated photocurrent. In this mode of operation, the photodiode is active 100 percent of the time while readout of the information from each photodiode takes only a small fraction of the time.

Periodic sequential sampling of the photo sensitive PN junctions 23-1 through 23-N causes a sequence of re-charge current pulses to flow into the common drains 25-1 and 25-2. The voltage developed by the re-charge current pulses flowing through a load resistor is the video signal which is proportional to the spacial distribution of illumination along the array averaged over the scanning period.

Two degrees of freedom are available for controlling the exposure of a given PN junction 23. If the light level is fixed, one may vary the integration time, while if the integration time is fixed, one may vary the light level. One can maintain a high element scan rate with increased integration time by merely delaying the start of the scan after the preceding end of the scan.

To start the scan, a negative pulse (FIG. 5*c*) is applied to the start lead. Diodes 32-1, 32-2 and resistor 33 provide gate protection with respect to accidental high voltage surges. The negative start pulse on the gate of FET transistor Q1 results in the drain of transistor Q1 and the source of transistor Q′ coming to approximately ground potential Consequently the gate of transistor Q2 comes to ground potential. Simultaneously with the start pulse a negative pulse of sufficient magnitude is applied to the $\phi$ 1 line 25-1 (FIG. 5*a*). This negative pulse results in the drain of transistor Q2 dropping to approximately the negative potential of the pulse on the $\Phi$ 1 line. The negative voltage on the drain of Q2 turns on gating transistors 31-1 and 31-2. The charge stored on photosensitive PN junctions 23-1 and 23-2 is thus restored to its normal value. The amounts of charge necessary to do this flow through video lines 25-1 and 25-2, respectively. The amounts are proportional to the light incident on junctions 23-1 and 23-2.

The start pulse has a duration between one-half the clock period and the clock period. Upon removal of the $\Phi_1$ clock pulse, the drain of Q1 and thus the gate of Q2 remains at ground potential. Upon termination of the start pulse, Q1's drain still remains at ground potential due to capacitances associated with Q1 and Q1'. The voltage on the drain of Q2 and thus the gate of Q3 remains at approximately the negative voltage of the $\Phi_1$ clock pulse due to the capacitances of Q2 and Q2' and low leakage currents.

When the $\Phi_1$ clock pulse terminates, the negative $\Phi_2$ clock pulse, which is 180° out of phase with the $\Phi_1$ clock pulse, begins. The negative $\Phi_2$ pulse turns on Q3' and Q4'. Q3 still remains on as a result of the negative voltage on its gate. Accordingly, Q4 remains off and Q4's drain voltage drops to the negative $\Phi_2$ voltage. This turns on gating transistors 31-3 and 31-4 and reads out signals representing the light incident on PN junctions 23-3 and 23-4.

When the voltage on the $\Phi_2$ line goes to ground and the voltage on the $\Phi_1$ line goes negative again, the drain of Q2 (gate of Q3) comes abruptly to ground due to the absence of a start pulse. The drain of Q3 (gate of Q4) likewise goes to and remains at ground until the next $\Phi 2$ pulse due to the capacitances of Q3 and Q3'. On the next $\Phi_2$ pulse the gate of Q4 goes negative, turning Q4 on and the drain of Q4 (gate of Q5) goes to ground. Thus, the start pulse is, in effect, propagated through the shift register sequentially reading out signals representing the charge stored on consecutive pairs of PN junctions 23.

Figure 6:
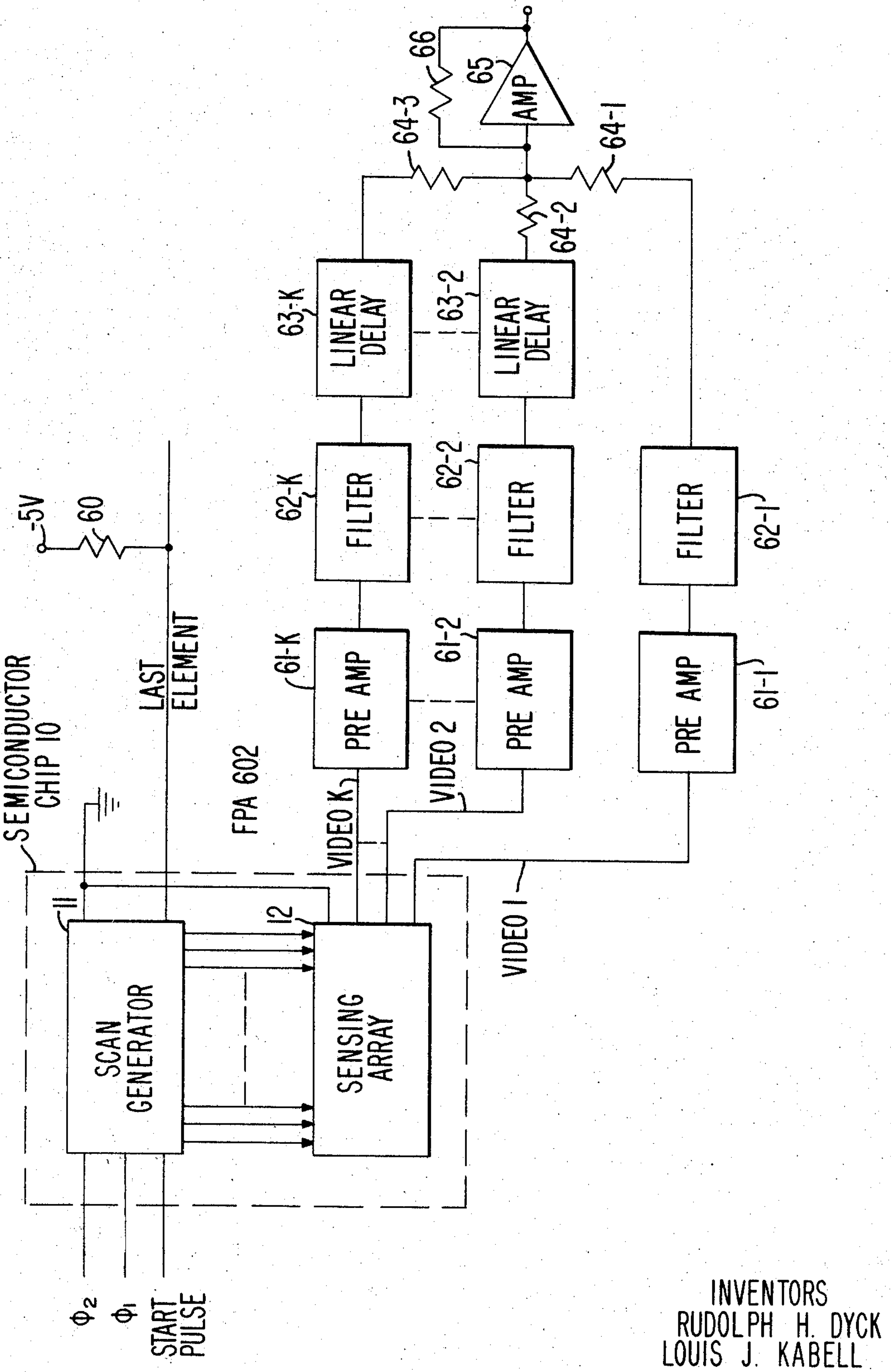
FIG. 6 shows structure for converting the parallel signals on a plurality of drain lines from parallel to serial.

FIG. 6 shows the way in which the output signals from the video drain lines 25-1 and 25-2 (FIGS. 1 and 3) are processed. FIG. 6, however, shows a circuit containing K such drain lines where K is a selected integer. As explained above in describing the scanning of the light sensing elements, one scanning pulse generated by scan generator 11 reads out a signal representing light incident on two light sensitive elements. In general, one such pulse can read out the signals representing the light incident upon K such light sensitive elements. This requires K video drain lines, as shown in FIG. 6.

The signals from K photosensitive elements are read out simultaneously and thus appear simultaneously on all K drain lines. These signals are then transmitted through corresponding preamplifiers 61 and filters 62. Filters 62 remove noise and assist in shaping the pulses. Then, the signals read out from the photosensitive elements are delayed amounts unique to each drain line in delays 63. The signal on video line 1 is not delayed at all and thus passes directly through resistor 64-1 to the input to amplifier 65. The signal on video line 2 is delayed in general by ½K × the period of the pulses from scan generator 11. Thus, if two video lines are used, linear delay 63-2 delays the output signal on video line 2 by one quarter of the period. The signal on the $K^{th}$ video drain line is delayed by (K-1) T/2K where T is the period of the pulses from scan generator 11. Thus, in essence, linear delays 63 convert the plurality of simultaneous output signals on video drain lines 1 through K from a set of parallel signals to a sequence of serial signals.

The use of K drain lines on each semiconductor chip to read out simultaneously K signals representing the light incident on K photosensitive elements makes it possible to obtain a high packing density for the photosensitive elements. This occurs because while each photosensitive element takes a small area of the chip, each scan generator stage and associated gating circuitry takes a much larger area. Thus, the number of photosensitive elements which can be placed on the chip is limited not by the size of each photosensitive element but rather by the sizes of the scan generator stages and the associated control circuitry. By using one scan generator stage to control the reading out of the signals from K photosensitive elements, this limitation on the resolution obtainable with a linear array is removed. In addition, the frequency of the clock 13 (FIG. 1) supplying the pulses to scan generator 11 is reduced to 1/K the frequency required when only one drain line is used. This is an important advantage when the system is frequency limited. This also improves the dynamic range (defined as the ratio of peak signal to noise level) of the system.

It should be noted the signals read out from each right hand chip 40 can be delayed by a given time relative to the signals read out from each left hand chip. This delay compensates for the vertical shift in location of the portion of the object detected by the left hand chips as opposed to the right hand chips. When reconstructing the images detected by the left hand and right hand chips to form one linear image, the portion of the object detected by the left hand chip is usually above the portion of the object detected by the right hand chip for left and right hand chips arranged as shown in FIG. 4. To compensate for this effect, either the scanning of the right hand chips can be delayed by the time required for the image to travel the distance between the light sensing element on the left hand chip and the light sensing elements on the right hand chip, or alternatively, the output signals read from the right hand chip can be delayed an equivalent amount before being combined with the signals read out from the left hand chips.

What is claimed is:

1. A bilinear array comprising:

a first plurality of semiconductor chips, each chip in said first plurality containing near one edge a multiplicity of light sensing elements, and each chip in said first plurality being arranged such that the edge of said chip nearest said light sensing elements faces and is adjacent to a given straight line and adjacent chips in said first plurality of semiconductor chips are spaced a selected distance apart along one side of said line; and a second plurality of semiconductor chips, each of said second plurality of semiconductor chips containing light sensing elements near one edge thereof, and each of said second plurality of semiconductor chips being arranged so that the edge of said chip nearest said light sensing elements faces and is adjacent to said line, said second plurality of semiconductor chips being spaced said selected distance apart along the other side of said line and each chip in said second plurality being opposite a space between the chips in said first plurality of light sensing chips, wherein each chip of each plurality chips comprises, in addition to said multiplicity of light sensing elements, a means for generating a sequence of M pulses where M is related to the number N of light sensitive elements on said chip by the relationship $M = (1/K) N$ where K is a selected integer; and a means, responsive to said sequence of pulses, for reading out signals representing the light incident on said light sensing elements, comprising N gating means, and K drain line means, each drain line being connected to N photosensitive elements, such that each photosensitive element is uniquely connected through a gating means to only one drain line, wherein K gating means made up of one gating means connected to each drain line means, are activated simultaneously by one pulse in said sequence of pulses, and wherein each drain line means includes a linear delay means for delaying the signals on said delay line means by a selected and unique amount.

2. Structure as in claim 1 including means for summing the delayed output signals from each drain line and means for producing a sequence of output signals from said light sensitive elements.

* * * * *